US011165105B2

(12) United States Patent
Okada et al.

(10) Patent No.: US 11,165,105 B2
(45) Date of Patent: Nov. 2, 2021

(54) POWER SUPPLY DEVICE, POWER STORAGE DEVICE, ELECTRONIC DEVICE, AND POWER SYSTEM

(71) Applicant: MURATA MANUFACTURING CO., LTD., Kyoto (JP)

(72) Inventors: Masami Okada, Fukushima (JP); Atsushi Minami, Fukushima (JP)

(73) Assignee: Murata Manufacturing Co., Ltd., Kyoto (JP)

(*) Notice: Subject to any disclaimer, the term of this patent is extended or adjusted under 35 U.S.C. 154(b) by 101 days.

(21) Appl. No.: 16/155,257

(22) Filed: Oct. 9, 2018

(65) Prior Publication Data

US 2019/0044195 A1 Feb. 7, 2019

Related U.S. Application Data

(63) Continuation of application No. PCT/JP2017/018369, filed on May 16, 2017.

(30) Foreign Application Priority Data

Jul. 15, 2016 (JP) .............................. JP2016-140194

(51) Int. Cl.
*H02J 7/00* (2006.01)
*H01M 10/44* (2006.01)
(Continued)

(52) U.S. Cl.
CPC ........ *H01M 10/44* (2013.01); *G01R 19/2513* (2013.01); *G01R 31/36* (2013.01);
(Continued)

(58) Field of Classification Search
CPC ......................................................... H02J 9/06
(Continued)

(56) References Cited

U.S. PATENT DOCUMENTS 5,739,667 A * 4/1998 Matsuda ............... H02J 7/0072
320/128
7,652,458 B2 * 1/2010 Park ...................... H02J 7/0072
323/282

(Continued)

FOREIGN PATENT DOCUMENTS

JP 2001294138 A 10/2001
JP 2004120857 A 4/2004
(Continued)

OTHER PUBLICATIONS

Japan Patent Office, International Search Report for Application No. PCT/JP2017/018369, dated Jun. 13, 2017.
(Continued)

*Primary Examiner* — Edward Tso
*Assistant Examiner* — Ahmed H Omar
(74) *Attorney, Agent, or Firm* — K&L Gates LLP

(57) ABSTRACT

Provided is a power supply device including a rectifier configured to convert an alternating current power from a system into a direct current power and supply the direct current power to a power storage device and a load, and a current sensor configured to detect one or both of a first direct current from the rectifier to the load and a second direct current from the rectifier to the power storage device, in which a measurement result of the current sensor is configured to be fed back to the rectifier to control an output current of the rectifier.

5 Claims, 5 Drawing Sheets

(51) Int. Cl.
    *G06F 1/3206*     (2019.01)
    *H02J 7/02*     (2016.01)
    *G01R 31/396*     (2019.01)
    *G01R 31/3842*     (2019.01)
    *H02J 9/06*     (2006.01)
    *G01R 31/36*     (2020.01)
    *G01R 19/25*     (2006.01)

(52) U.S. Cl.
    CPC ....... *G01R 31/3842* (2019.01); *G01R 31/396* (2019.01); *G06F 1/3206* (2013.01); *H02J 7/007* (2013.01); *H02J 7/0047* (2013.01); *H02J 7/02* (2013.01); *H02J 9/06* (2013.01)

(58) Field of Classification Search
    USPC .......................................................... 307/48
    See application file for complete search history.

(56) References Cited

U.S. PATENT DOCUMENTS

| | | | |
|---|---|---|---|
| 7,683,580 B2 | 3/2010 | Matsushima et al. | |
| 8,080,900 B2 * | 12/2011 | Corhodzic | G06F 1/263 307/66 |
| 2006/0119320 A1 * | 6/2006 | Nork | H02J 7/045 320/128 |
| 2013/0088081 A1 * | 4/2013 | Siri | H02J 7/35 307/46 |
| 2016/0099607 A1 * | 4/2016 | Landis | H02J 3/30 307/46 |

FOREIGN PATENT DOCUMENTS

| | | |
|---|---|---|
| JP | 2007078672 A | 3/2007 |
| JP | 2013200312 A | 10/2013 |
| WO | 2014207994 A1 | 12/2014 |

OTHER PUBLICATIONS

Japanese Office Action dated Sep. 10, 2019 in corresponding Japanese Application No. 2016-140194.

* cited by examiner

POWER SUPPLY DEVICE, POWER STORAGE DEVICE, ELECTRONIC DEVICE, AND POWER SYSTEM

CROSS REFERENCE TO RELATED APPLICATIONS

The present application is a continuation of PCT patent application no. PCT/JP2017/018369, filed on May 16, 2017, which claims priority to Japanese patent application no. JP2016-140194 filed on Jul. 15, 2016, the entire contents of which are being incorporated herein by reference.

BACKGROUND

The present technology generally relates to, for example, a power supply device, a power storage device, an electronic device, and a power system using a lithium ion secondary battery.

It is known to construct an emergency direct current power supply device by using a power storage device in which a plurality of single cells (also referred to as battery cells) are connected in series. For example, an emergency power supply device includes two power storage devices and a rectifier connected in series to an alternating current power supply and a configuration in which a load and a storage battery are connected in parallel to an output of the rectifier. A charger charges the storage battery. A nickel-hydrogen secondary battery is used instead of a lead storage battery, and one of the storage batteries can be charged (supplementarily charged) by the output of the rectifier.

SUMMARY

The conventional technology as described above may deteriorate reliability of an emergency power supply and may adversely affect battery life and the like.

Accordingly, an object of the present technology is to provide a power supply device, a power storage device, an electronic device, and a power system that can safely perform charge and discharge without deteriorating reliability of an emergency power supply.

According to an embodiment of the present technology, a power supply device is provided. The power supply device includes a rectifier configured to convert an alternating current power from a system into a direct current power and supply the direct current power to a power storage device and a load, and a current sensor configured to detect one or both of a first direct current from the rectifier to the load and a second direct current from the rectifier to the power storage device, in which a measurement result of the current sensor is configured to be fed back to the rectifier to control an output current of the rectifier.

According to another embodiment of the present technology, the present technology further provides a power storage device in which float charging is performed with a direct current power to be supplied from a rectifier configured to convert an alternating current power from a system to a direct current power, and a charge current is configured to be controlled according to a direct current output from the rectifier to the load.

According to an embodiment of the present technology, an electronic device is provided. The electronic device is configured to receive supply of electric power from the above-described power storage device.

According to another embodiment of the present technology, a power system is provided. The power system is configured to receive supply of electric power from the above-described power storage device.

According to at least one embodiment, the present technology enables replacement of a lead storage battery with a lithium ion storage battery without changing the system configuration of a conventional emergency power supply. In addition, since a special charger for lithium ion batteries is not used, charge and discharge can be safely performed without deteriorating reliability of an emergency power supply. The effects described herein are non-limiting, and other suitable properties relating to the present technology may be realized and as further described.

DETAILED DESCRIPTION

The present technology generally relates to, for example, a power supply device, a power storage device, an electronic device, and a power system using a lithium ion secondary battery. As described herein, the present disclosure will be described based on examples with reference to the drawings, but the present disclosure is not to be considered limited to the examples, and various numerical values and materials in the examples are considered by way of example.

Figure 1:
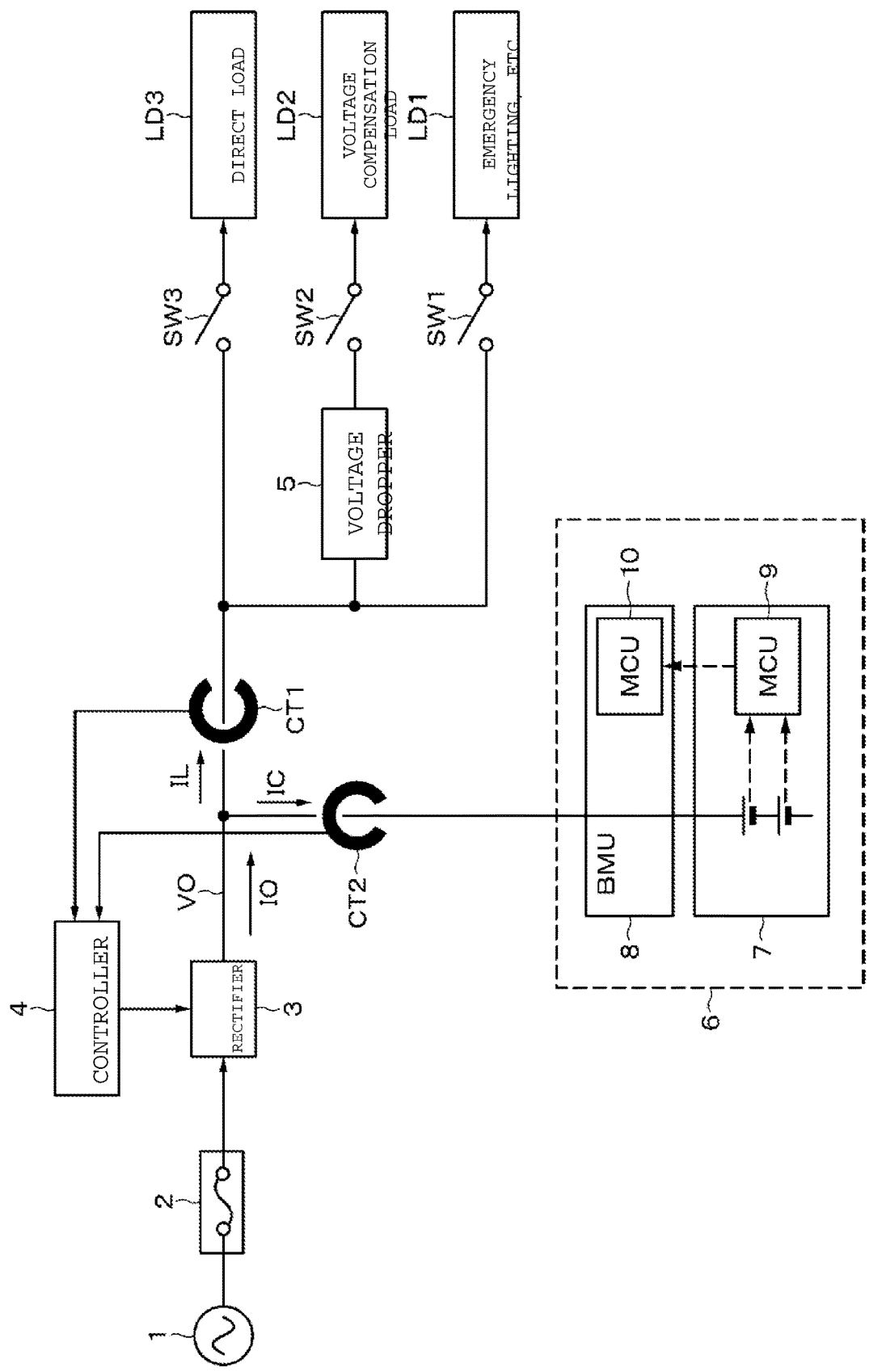
FIG. 1 is a block diagram illustrating a system configuration according to an embodiment of the present technology.

A system configuration of a first embodiment of the present technology will be described with reference to FIG. 1. An alternating current (AC) power from a system 1 is supplied to a rectifier 3 via a fuse 2. The rectifier 3 has a function of converting the AC power into a direct current (DC) power. The rectifier 3 outputs a constant output voltage VO, and a value of an output current IO can be controlled according to a control signal from a controller 4.

The output current of the rectifier 3 is supplied to an emergency load LD1 via a switch SW1. Further, the output current of the rectifier 3 is supplied to a voltage compensation load LD2 via a voltage dropper 5 and a switch SW2. Furthermore, the output current of the rectifier 3 is supplied to a direct load LD3 via a switch SW3. These switches SW1, SW2, and SW3 may be controlled by a control signal from a control unit (not shown). Alternatively, the control unit is not provided, the switch SW1 is constituted by a relay, switching between on and off is performed depending on presence or absence of the AC power from the system 1, and SW2 and SW3 may be constituted by a breaker so that a tripping occurs when an overcurrent flows. The emergency load LD1, the voltage compensation load LD2, and the direct load LD3 are installed in factories, radio base stations, and the like with only the SW1 as a relay.

The emergency load LD1 is a load requiring power supply only at the time of power failure, for example, emergency lighting. The voltage compensation load LD2 is a load (electronic device or the like) capable of operating in a predetermined voltage range (for example, 90 V to 110 V). The voltage dropper 5 controls so that the voltage supplied to the voltage compensation load LD2 falls within a predetermined range. The direct load LD3 is a load to which electric power is supplied in a normal state other than the voltage compensation load LD2. LD2 and LD3 can be said to be loads to which electric power is constantly supplied irrespective of power failure, and LD1 can be said to be a load to which electric power is supplied only at the time of power failure. As an example, in a normal state, the switches SW2 and SW3 are turned on, and the switch SW1 is turned off. When a power failure occurs, the switches SW2 and SW3 are turned on, and the switch SW1 is also turned on.

A portion of the output current IO of the rectifier 3 is supplied as a charge current IC to a power storage device 6. The power storage device 6 includes a battery unit 7 and a battery module controller (BMU) 8 including a processor. Microcontroller units (MCU) 9 and 10 include processors, and are provided respectively in the battery unit 7 and the battery module controller 8. Communication may be performed between these microcontroller units 9 and 10. In this example, although the battery unit 7 and the battery module controller (BMU) 8 are separately provided, they may be integrated.

The battery unit 7 of the power storage device 6 has a configuration in which a plurality of battery cells are connected in series and in parallel. The voltage of each battery cell of the battery unit 7 is monitored, and the operation of the battery unit 7 is controlled by the battery module controller 8. The battery unit 7 is float charged by the output current of the rectifier 3. That is, when the battery unit 7 is fully charged by the rectifier 3, the charge current becomes zero even if voltage application is continued, and overcharge is prevented. However, in the case of a lithium ion secondary battery, when charge is performed with a very large charge current, deterioration of the battery progresses, so that the life is shortened; therefore, the charge current is prevented from becoming excessive.

In the normal state, electric power is supplied to the voltage compensation load LD2 and the direct load LD3 via the switches SW2 and SW3. If electric power required on the load side is greater than the supply power of the rectifier 3, electric power may be supplied from the power storage device 6 to the load side. When a power failure occurs, electric power is supplied from the power storage device 6 to the emergency load LD1.

A current sensor CT1 that detects a load current IL flowing to the load side is provided, and a current sensor CT2 that detects the charge current IC flowing to the power storage device 6 is provided. As the current sensors CT1 and CT2, a clamp type ammeter having a Hall element can be used. The clamp type ammeter can measure a current value without cutting a transmission line. Although the current sensors CT1 and CT2 are provided in FIG. 1, if the output current of the rectifier 3 is IO, since there is a relationship of (IO=IL+IC), one of the current sensors may be provided.

Figure 2:
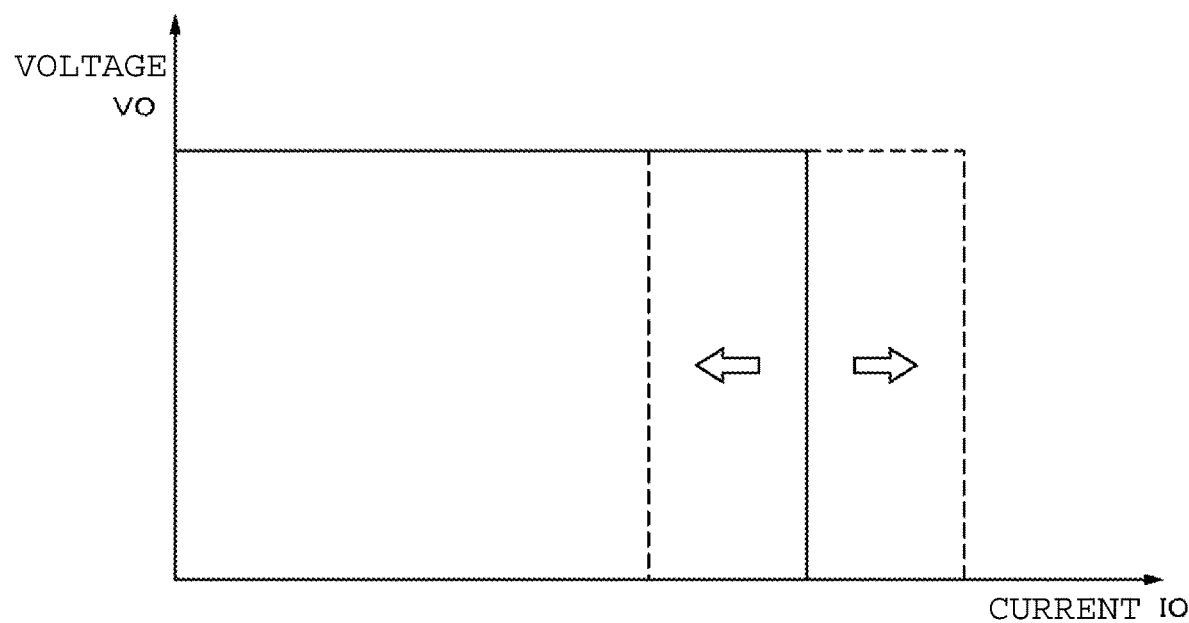
FIG. 2 is a schematic diagram illustrating output voltage-output current characteristics of a rectifier according to an embodiment of the present technology.

Information on the currents IL and IC detected respectively by the current sensors CT1 and CT2 is supplied to the controller 4. The controller 4 controls the output current IO of the rectifier 3 based on the information on the currents IL and IC. The characteristics of the output voltage VO and the output current IO of the rectifier 3 are shown in FIG. 2. VI characteristics during normal operation are indicated by a solid line. In the rectifier 3, the output voltage VO is constant, and the output current IO is controlled by the controller 4. The output current IO varies linearly or stepwise.

While the current IC flowing to the power storage device 6 side and the current IL flowing to the load side are measured by the current sensors CT1 and CT2, the value of the output current is shifted as indicated by the dotted line based on a charge state of the battery unit 7 and demand power of the load. As a result, the charge current IC can be controlled according to the temperature and the degree of deterioration of the battery unit 7 even without a special charger, which contributes to prolonging the life of the battery.

Figure 3:
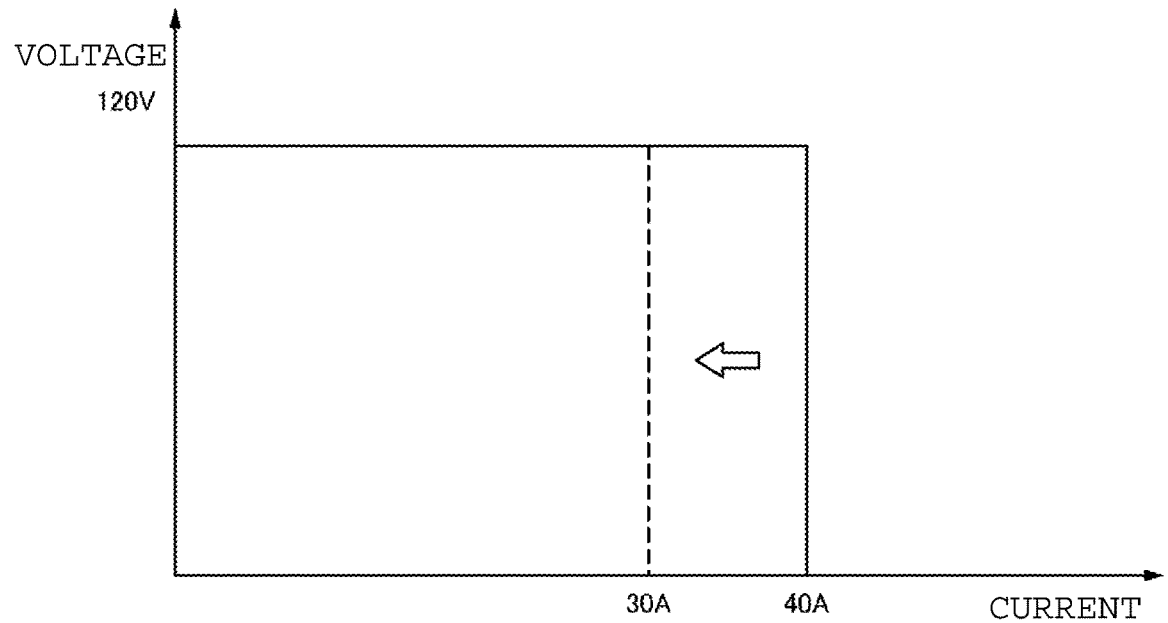
FIG. 3 is a schematic diagram for describing an example of operation according to an embodiment of the present technology.

In the first embodiment described above, a maximum value of the output current IO of the rectifier 3 is 40 A as shown in FIG. 3. The charge current IC to the power storage device 6 is 20 A, and the load current IL is 20 A. In this state, when the load current IL decreases to 10 A, the charge current IC becomes 30 A. The charge current IC (=30 A) is large for the battery of the battery unit 7, so that the battery deteriorates. In the present technology, a decrease in the load current IL is detected by the current sensor CT1, or an increase in the charge current IC is detected by the current sensor CT2, and the detection result is fed back to the controller 4. The controller 4 decreases the output current IO of the rectifier 3 to 30 A as indicated by a broken line in FIG. 3. As a result, the charge current IC is suppressed to 20 A, and deterioration of the battery unit 7 is prevented.

Conversely, when the load current IL increases to 30 A, the charge current IC decreases to 10 A. As a result, a maximum value 20 A of the charge current IC is prevented from being exceeded. When the load current IL exceeds 40 A, the output of the rectifier 3 is insufficient. In this case, the shortage is compensated by a discharge current from the power storage device 6.

Figure 4:
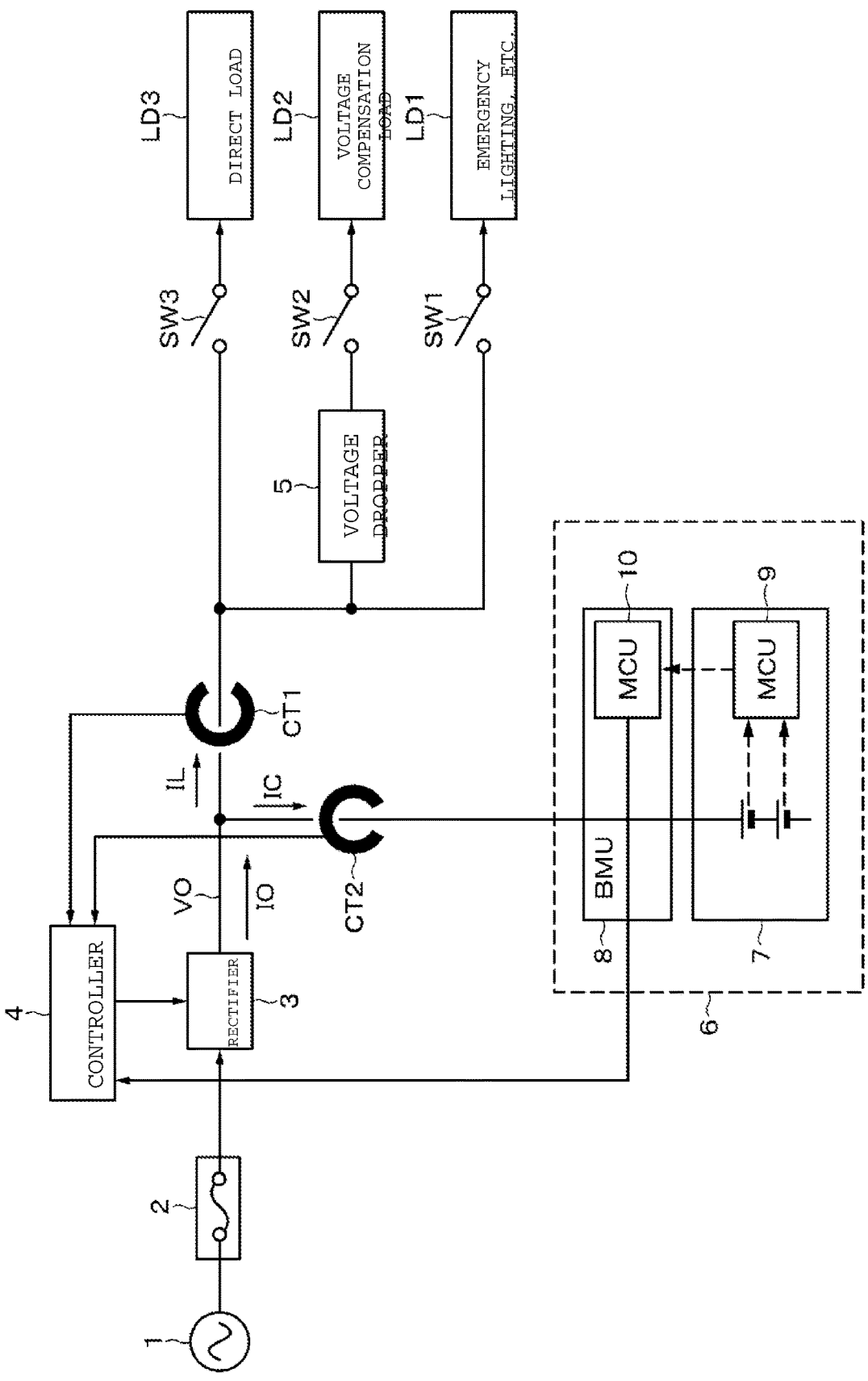
FIG. 4 is a block diagram illustrating a system configuration according to an embodiment of the present technology.

A second embodiment of the present technology will be described with reference to FIG. 4. The state of the battery unit 7 of the power storage device 6 is transmitted from the microcontroller unit 10 of the battery module controller 8 of the power storage device 6 to the controller 4 of the rectifier 3, and the controller 4 controls the output current of the rectifier 3 according to the state of the battery unit 7. For example, the temperature of the battery unit 7 is detected as a state, and information on the detected temperature is transmitted to the controller 4 through the microcontroller units 9 and 10.

Figure 5:
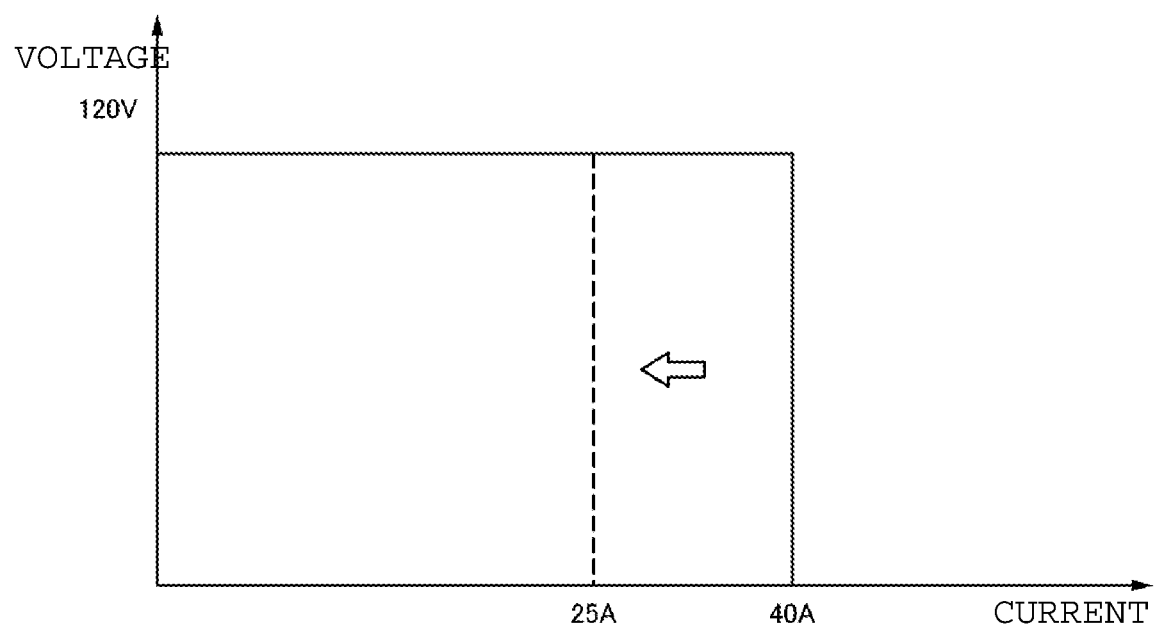
FIG. 5 is a schematic diagram for describing an example of operation according to another embodiment of the present technology.

From the obtained temperature information, the controller 4 controls the output current IO of the rectifier 3 based on the load current IL to control the charge current IC to the power storage device 6. For example, the maximum value of the output current IO of the rectifier 3 is 40 A as indicated by a solid line in FIG. 5. The charge current IC to the power storage device 6 is 20 A, and the load current IL is 20 A. Assume that the temperature of the battery unit 7 drops to 5° C. The lithium ion secondary battery deteriorates when charged at low temperature of not more than 5° C. with a large current. Thus, as indicated by a broken line in FIG. 5, the output current IO of the rectifier 3 is set to 25 A. When the output current value is thus set to 25 A, a charge current 5 A obtained by subtracting the load current 20 A from the output current IO flows to the power storage device 6, so that charge control with suppressed deterioration becomes possible. As the state of the battery unit 7 of the power storage device 6, in addition to the temperature, a remaining capacitance, a deteriorated state, a battery voltage, and the like may be used.

According to the embodiments of the present technology, it is possible to replace a lead storage battery with a lithium ion storage battery without changing the system configuration of a conventional emergency power supply. In addition, since a special charger for lithium ion secondary batteries is not used, charge and discharge can be safely performed without deteriorating reliability of an emergency power supply. Further, excessive charge current can be prevented from flowing by controlling the output current of the rectifier, deterioration of the power storage device (battery unit) can be prevented, and the life can be prolonged. Furthermore, an amount of current is controlled by the rectifier according to a required amount of the load and the state of the storage battery, whereby it is possible to perform charge according to the state of the battery and surrounding environment. Thus, it is possible to use the storage battery with a long life.

Figure 6:
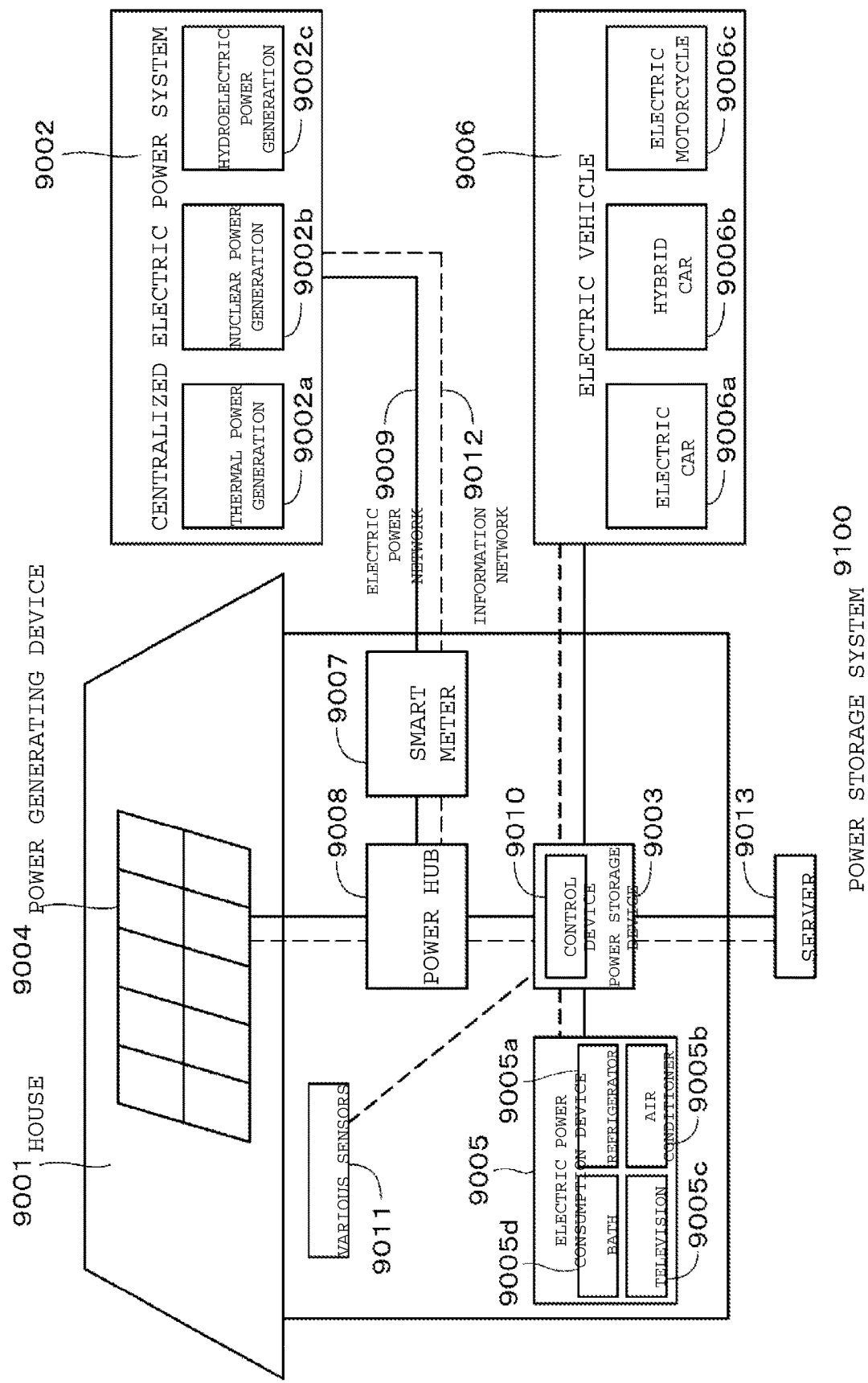
FIG. 6 is a schematic diagram illustrating a power storage system for a house according to an embodiment of the present technology.

An example in which the present disclosure is applied to a power storage system for a house will be described referring to FIG. 6. For example, in a power storage system 9100 for a house 9001, electric power is supplied from a centralized electric power system 9002 such as thermal power generation 9002*a*, nuclear power generation 9002*b*, or hydroelectric power generation 9002*c* to a power storage device 9003 via an electric power network 9009, an information network 9012, a smart meter 9007, a power hub 9008, or the like. At the same time, electric power is supplied from an independent power source such as a home power generating device 9004 to the power storage device 9003. The electric power supplied to the power storage device 9003 is stored. Electric power used in the house 9001 is supplied using the power storage device 9003. Not only the house 9001 but also a building can use a similar power storage system.

The house 9001 is provided with the power generating device 9004, an electric power consumption device 9005, the power storage device 9003, a control device 9010 for controlling devices, the smart meter 9007, and a sensor 9011 for acquiring various information. The devices are connected to each other via the electric power network 9009 and the information network 9012. As the power generating device 9004, a solar cell, a fuel cell, or the like is used, and generated electric power is supplied to the electric power consumption device 9005 and/or the power storage device 9003. The electric power consumption device 9005 is a refrigerator 9005*a*, an air conditioner 9005*b*, a television receiver 9005*c*, a bath 9005*d*, or the like. Furthermore, the electric power consumption device 9005 further includes an electric vehicle 9006. The electric vehicle 9006 is an electric car 9006*a*, a hybrid car 9006*b*, an electric motorcycle 9006*c*, or the like.

The above-described battery unit of the present disclosure is applied to the power storage device 9003. The power storage device 9003 is constituted by a secondary battery or a capacitor. For example, the power storage device 9003 is constituted by a lithium ion battery. The lithium ion battery may be a stationary type or may be used in the electric vehicle 9006. The smart meter 9007 has a function of measuring a use amount of commercial electric power, and transmitting the measured use amount to an electric power company. The electric power network 9009 may be any one of DC power supply, AC power supply, and non-contact power supply, or a combination of two or more of these.

Examples of the various sensors 9011 include a human sensor, an illuminance sensor, an object detection sensor, a consumed electric power sensor, a vibration sensor, a contact sensor, a temperature sensor, and an infrared sensor. Information acquired by the various sensors 9011 is transmitted to the control device 9010. With the information from the sensors 9011, weather conditions, human conditions, and the like are grasped, and the electric power consumption device 9005 is automatically controlled so as to minimize energy consumption. Furthermore, the control device 9010 can transmit information on the house 9001 to an external electric power company or the like via internet.

The power hub 9008 performs processing such as branching of an electric power line or DC-AC conversion. A communication method of the information network 9012 connected to the control device 9010 includes a method of using a communication interface such as universal asynchronous receiver-transmitter (UART): asynchronous serial communication transmitter/receiver circuit) and a method of using a sensor network by a wireless communication standard, such as Bluetooth (registered trademark), ZigBee (registered trademark), or Wi-Fi. The Bluetooth (registered trademark) method is applied to multimedia communication and can perform one-to-many communication. ZigBee uses a physical layer of institute of electrical and electronics engineers (IEEE) 802.15.4. IEEE 802.15.4 is a name of a short-distance wireless network standard called personal area network (PAN) or wireless (W) PAN.

The control device 9010 is connected to an external server 9013. This server 9013 may be managed by any one of the house 9001, an electric power company, and a service provider. For example, information transmitted or received by the server 9013 is consumption electric power information, life pattern information, electric power charge, weather information, natural disaster information, or information about electric power transaction. Although a home electric power consumption device (for example, a television receiver) may transmit or receive the above information, an outside-home device (for example, a mobile phone) may transmit or receive the information. A device having a display function, such as a television receiver, a mobile phone, or personal digital assistants (PDA) may display the information.

The control device 9010 for controlling units is formed by a central processing unit (CPU), a random access memory (RAM), a read only memory (ROM), and the like, and is housed in the power storage device 9003 in this example. The control device 9010 is connected to the power storage device 9003, the home power generating device 9004, the electric power consumption device 9005, the various sensors 9011, and the server 9013 via the information network 9012, and for example, has a function of adjusting a use amount of commercial electric power and a power generation amount. In addition, the controller 9010 may have a function of performing electric power transaction in an electric power market.

As described above, the power storage device 9003 can store not only electric power from the centralized electric power system 9002 such as the thermal power generation 9002*a*, the nuclear power generation 9002*b*, or the hydroelectric power generation 9002*c* but also electric power generated by the home power generating device 9004 (solar power generation or wind power generation). Accordingly, even when the electric power generated by the home power generating device 9004 fluctuates, controls to keep the amount of electric power to be sent to an outside constant or to discharge by a necessary amount of electric power can be performed. For example, the following method of use is possible. That is, electric power obtained by solar power generation is stored in the power storage device 9003, midnight electric power the charge of which is low at night is stored in the power storage device 9003, and electric power stored in the power storage device 9003 is used by discharging in daytime in which electric power charge is high.

In this example, the control device 9010 housed in the power storage device 9003 has been exemplified, but the control device 9010 may be housed in the smart meter 9007, or may be formed alone. Furthermore, the power storage system 9100 may be used for a plurality of homes in a multiple dwelling house or a plurality of detached houses.

An example of the power storage system 9100 to which the technology according to the present disclosure can be applied has been described above. The technology according to the present technology can be suitably applied to the power storage device 9003 among the above-described configurations. However, in the present technology, since the DC power is supplied, it is necessary to convert the DC power into the AC power and supply the AC power to household AC equipment.

Although one embodiment of the present technology has been specifically described, the present technology is not limited to the above-described embodiment. Various modifications of the present technology can be made based on the technical spirit of the present technology. For example, although the example in which the battery units 7 are connected in series and in parallel has been shown, the battery units 7 may be connected only in series or in parallel. The configurations, the methods, the processes, the shapes, the materials, the numerical values, and the like mentioned in the above-described embodiments are merely examples. Different configurations, methods, processes, shapes, materials, numerical values, and the like may be used according to embodiments of the present technology.

The present technology is described below in further detail according to an embodiment.

(1)

A power supply device including a rectifier that converts an alternating current power from a system into a direct current power and supplies the direct current power to a power storage device and a load, and a current sensor that detects one or both of a direct current from the rectifier to the load and a direct current from the rectifier to the power storage device, in which a measurement result of the current sensor is fed back to the rectifier to variably control an output current of the rectifier.

(2)

The power supply device according to (1), in which a power supply is supplied directly to the load from the rectifier and the power storage device.

(3)

The power supply device according to (1), in which electric power is supplied from the power storage device to the load at a time of power failure.

(4)

The power supply device according to (3), in which a discharge current of the power storage device is supplied to the load when the direct current to the load becomes larger than the output current of the rectifier.

(5)

The power supply device according to (1), in which the output current of the rectifier is decreased when current to the load decreases.

(6)

The power supply device according to (1), in which the output current of the rectifier is decreased when current to the power storage device increases.

(7)

The power supply device according to (1), in which the output current of the rectifier is controlled according to a state of a battery unit of the power storage device.

(8)

The power supply device according to (7), in which the state of the battery unit is at least one of a battery voltage, a remaining capacitance, a deteriorated state, and a battery temperature.

(9)

A power storage device, in which charge is performed with a direct current power to be supplied from a rectifier configured to convert an alternating current power from a system to the direct current power, and a charge current is variably controlled according to a direct current output from the rectifier to the load.

(10)

The power storage device according to (9), in which an output current of the rectifier is controlled according to a state of a battery unit of the power storage device.

(11)

The power storage device according to (10), in which the state of the battery unit is at least one of a battery voltage, a remaining capacitance, a deteriorated state, and a battery temperature.

(12)

An electronic device receiving supply of electric power from the power storage device according to (9).

(13)

A power system receiving supply of electric power from the power storage device according to (9).

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The invention claimed is:

1. A power supply device, comprising:
   a rectifier configured to convert an alternating current power from a system into a direct current power and to output a constant voltage and an output current IO, wherein the output current IO is variable; and
   a first current sensor configured to detect a first direct current IL from the rectifier to a load and a second current sensor configured to detect a second direct current IC from the rectifier to a power storage device,
   wherein the output current IO satisfies a relationship of IO=IL+IC,
   a controller configured to control the output current IO of the rectifier based on information on the first direct current IL and the second direct current IC, and
   wherein the controller is configured to decrease the output current IO of the rectifier when the first direct current IL decreases and the second direct current IC increases so that the second direct current IC is prevented from exceeding a maximum value of a charge current of the power storage device, and
   wherein the output current of the rectifier is configured to be controlled according to a state of a battery unit of the power storage device, and the state of the battery unit includes one or more of a remaining capacitance and a deteriorated state.

2. The power supply device according to claim 1, wherein electric power is configured to be supplied from the power storage device to the load at a time of power failure.

3. The power supply device according to claim 1, wherein a discharge current of the power storage device is configured to be supplied to the load when current to the load becomes larger than the output current of the rectifier.

4. The power supply device according to claim 1, wherein the state of the battery unit includes one or more of a battery voltage and a battery temperature.

5. The power supply device according to claim 1, wherein the power supply device is configured to supply power to either of a lead storage battery or a lithium ion storage battery.

* * * * *